US012112963B2

(12) United States Patent
Hiroi et al.

(10) Patent No.: US 12,112,963 B2
(45) Date of Patent: Oct. 8, 2024

(54) DEFECT INSPECTION APPARATUS AND DEFECT INSPECTION PROGRAM

(71) Applicant: Hitachi High-Tech Corporation, Tokyo (JP)

(72) Inventors: Takashi Hiroi, Tokyo (JP); Nobuaki Hirose, Tokyo (JP); Takahiro Urano, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 598 days.

(21) Appl. No.: 17/419,581

(22) PCT Filed: Mar. 6, 2019

(86) PCT No.: PCT/JP2019/008793
§ 371 (c)(1),
(2) Date: Jun. 29, 2021

(87) PCT Pub. No.: WO2020/179000
PCT Pub. Date: Sep. 10, 2020

(65) Prior Publication Data
US 2022/0084856 A1 Mar. 17, 2022

(51) Int. Cl.
*G06K 9/00* (2022.01)
*G06T 7/00* (2017.01)
(Continued)

(52) U.S. Cl.
CPC ........ *H01L 21/67288* (2013.01); *G06T 7/001* (2013.01); *G06T 7/74* (2017.01); *G06T 2200/24* (2013.01); *G06T 2207/30148* (2013.01)

(58) Field of Classification Search
CPC ... H01L 21/67288; H01L 22/12; H01L 22/20; H01L 21/67259; G06T 7/74; G06T 7/001;
(Continued)

(56) References Cited

U.S. PATENT DOCUMENTS 6,242,270 B1   6/2001 Nagaswami et al.
7,365,295 B2 * 4/2008 Kurata ................ G02B 21/245
                                              382/255
(Continued)

FOREIGN PATENT DOCUMENTS

JP   2001-522541 A   11/2001
JP   2003-83734 A    3/2003
(Continued)

OTHER PUBLICATIONS

International Search Report (PCT/ISA/210) issued in PCT Application No. PCT/JP2019/008793 dated Apr. 2, 2019 with English translation (five (5) pages).
(Continued)

*Primary Examiner* — Avinash Yentrapati
(74) *Attorney, Agent, or Firm* — Crowell & Moring LLP (57) ABSTRACT

The objective of the present invention is provide a defect inspection apparatus that increases defect position precision and can easily align a coordinate origin offset between a reviewing apparatus and the defect inspection apparatus, even when design data cannot be obtained or it is difficult to sufficiently use the design data. The defect inspection apparatus according to the present invention acquires a wafer swath image necessary for inspection, and uses the swath image to detect defects and calculate a positional deviation amount. During the calculation of the positional deviation amount, a template pattern is acquired from one arbitrary swath image via an image processing unit, and the template pattern and a plurality of swath images of the entire wafer are compared, whereby the positional deviation amount for a position corresponding to the template pattern on the wafer is calculated. For positions at which the template pattern is not present, an interpolated positional deviation amount is calculated by executing an interpolation operation by using the calculated positional deviation amount. A defect position is corrected on the basis of the positional deviation amount and the interpolated positional deviation amount, or by using a positional deviation map in which these positional deviation amounts have been mapped on the entire wafer.

14 Claims, 8 Drawing Sheets

(51) Int. Cl.
*G06T 7/73* (2017.01)
*H01L 21/67* (2006.01)

(58) Field of Classification Search
CPC ....... G06T 2200/24; G06T 2207/30148; G06T 2207/10061; G06T 7/0008; G01N 2021/8861; G01N 2021/8887; G01N 21/9501; G01N 21/95607
See application file for complete search history.

(56) References Cited

U.S. PATENT DOCUMENTS

| | | | |
|---|---|---|---|
| 10,127,653 | B2 | 11/2018 | Duffy et al. |
| 2011/0133066 | A1 | 6/2011 | Nozoe et al. |
| 2013/0322737 | A1 | 12/2013 | Murakami et al. |
| 2018/0293720 | A1* | 10/2018 | Yoshitake ................. G03F 7/20 |

FOREIGN PATENT DOCUMENTS

| | | | |
|---|---|---|---|
| JP | 2010-73703 | A | 4/2010 |
| JP | 2011222636 | A * | 11/2011 |
| JP | 2013-64632 | A | 4/2013 |
| JP | 2013-148349 | A | 8/2013 |
| JP | 2013-164422 | A | 8/2013 |
| JP | 2013-246162 | A | 12/2013 |
| JP | 2015-200658 | A | 11/2015 |
| JP | 2017-529684 | A | 10/2017 |

OTHER PUBLICATIONS

Japanese-language Written Opinion (PCT/ISA/237) issued in PCT Application No. PCT/JP2019/008793 dated Apr. 2, 2019 (four (4) pages).

* cited by examiner

■ : FORWARD SCAN DATA
● : REVERSE SCAN DATA

DEFECT INSPECTION APPARATUS AND DEFECT INSPECTION PROGRAM

TECHNICAL FIELD

The present invention relates to a defect inspection apparatus which inspects a defect included in a wafer.

BACKGROUND ART

Semiconductor devices are manufactured by subjecting a silicon wafer to various processing. In the process of a semiconductor manufacturing, a pattern failure or a defect different from a normal part is unintentionally formed in the process of forming a pattern on the silicon wafer, which may lead to an operation failure of a semiconductor device. It is therefore important for yield improvement to, if the pattern failure or defect different from the normal part exists in the pattern on the wafer in the process of manufacturing, detect it in line and feed back the result of its detection to the semiconductor manufacturing process. A pattern inspection apparatus (defect inspection apparatus) is an apparatus that detects each defect on the semiconductor wafer as position information. The detected coordinate information of defect is used to obtain an enlarged image of the defect by a reviewing apparatus such as a review SEM (scanning electron microscope). The acquired image of the review SEM is used for specifying the type of the defect, but this result is used for state management of the manufacturing process or the like. It is based on, for example, a method such as monitoring the frequency distribution of the number of defects for each defect type.

A general defect inspection apparatus irradiates a wafer mounted on a stage with light while moving the stage, detects scattered light or reflected light generated by the light irradiation to acquire an image, and performs comparison calculation processing using the acquired image to detect a defect. Various algorithms such as die comparison, cell comparison, and design data comparison have been developed as a method of comparison calculation. Here, the die is a silicon wafer chip on which an integrated circuit is printed, and the cell is an area in the die where a minimum repetitive pattern is formed.

As described above, the defect inspection apparatus is an apparatus that acquires the position information of the defect. It is very important to improve the detection accuracy of the defect position in terms of improving the accuracy of defect inspection and sharing the coordinate information with the review SEM. However, the accuracy of the defect coordinates detected by the defect inspection apparatus is affected and reduced by various factors such as an error in wafer alignment, a fluctuation in the stage moving speed, and a fluctuation in the output of an AD converter, etc. For this reason, various technical contrivances have heretofore been taken to improve the detection accuracy of defect coordinates.

In the following Patent Literature 1, there has been disclosed a technique of setting a reference chip onto a wafer, using a specific pattern in the reference chip as a reference pattern, comparing an image of a pattern corresponding to the above-described reference pattern existing in a chip to be inspected and an image of the reference pattern, regarding a deviation amount between these images as a deviation amount of each chip image, and thereby correcting the position coordinates of a detected defect.

In the following Patent Literature 2, there has been disclosed a technique of aligning a patch image cut out from an image to be inspected with design data to thereby reprint it and using the result of the alignment to evaluate a deviation amount of the patch image.

CITATION LIST

Patent Literature

PTL 1: Japanese Unexamined Patent Application Publication No. 2011-222636
PTL 2: Japanese Unexamined Patent Application Publication (Translation of PCT Application) No. 2017-529684 (U.S. Pat. No. 10,127,653)

SUMMARY OF INVENTION

Technical Problem

In the technique described in Patent Literature 1, the coordinates of the reference pattern are calculated by the inspection apparatus, and the coordinate information on which the influence of the above factors is applied as it is used as the coordinates of the reference pattern. Therefore, even if the coordinates of the reference pattern and the coordinates of the pattern equivalent to the reference pattern in the chip to be inspected are compared, it means that the coordinates with errors are compared with each other, and hence the correct positional deviation information cannot be obtained.

Further, the technique described in Patent Literature 2 presupposes that the amount of positional deviation is obtained by comparing an image cut out from a physical layout pattern of a semiconductor chip with a patch image, and all design data of the chip (or die) are available. However, the design data is secret information of a semiconductor device manufacturer, and the manufacturer of the inspection apparatus is often prohibited from using in the first place or cannot use it easily. Therefore, it is often not possible for the manufacturer of the inspection apparatus to realistically design or manufacture software for the above image comparison.

The present invention has been made in view of the above problems, and an object thereof is to provide a defect inspection method or a defect inspection apparatus capable of improving defect position accuracy even when it is difficult or impossible to use the design data.

Solution to Problem

As mentioned above, the manufacturer of the inspection apparatus is not capable of using the design data of the semiconductor chip, but the semiconductor manufacturer who is the user of the inspection apparatus is in a position to be able to freely use the design information. Further, as for the specific pattern on the physical layout of the chip, the semiconductor manufacturer holds the position information in the chip as absolute coordinates associated with the coordinate system of the chip design.

The present invention has been conceived in view of the above situation. The present invention solves the problems of the related art by providing an inspection apparatus with a function of registering coordinate information associated with a pattern in accordance with the designation of a template pattern for positional deviation correction.

Advantageous Effects of Invention

According to the defect inspection apparatus according to the present invention, since the positional deviation amount between the template pattern and the image to be inspected is obtained based on the absolute coordinates, the positional deviation of the defect coordinates can be corrected with higher accuracy than before.

DESCRIPTION OF EMBODIMENTS

First Embodiment

Figure 1:
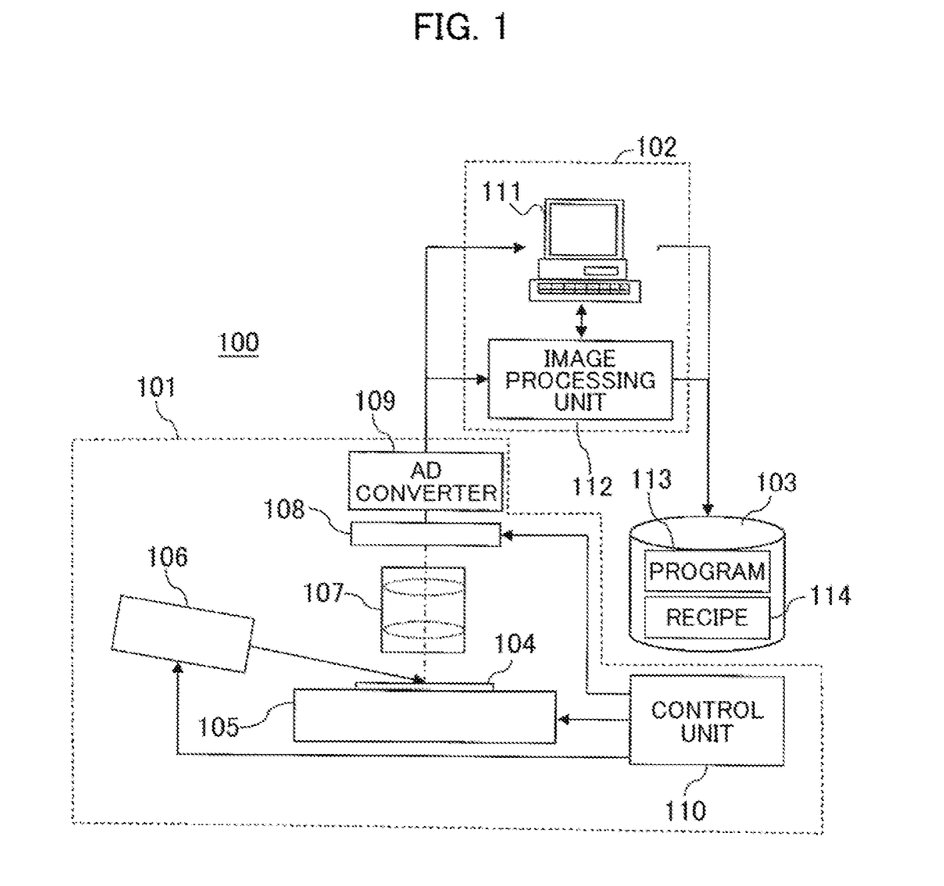
FIG. 1 is a configuration diagram of a defect inspection apparatus 100 according to a first embodiment.

FIG. 1 is a configuration diagram of a defect inspection apparatus 100 according to a first embodiment of the present invention. The defect inspection apparatus 100 is an apparatus that detects a defect (or a portion that may be a defect) existing in a pattern formed on a wafer 104, identifies a candidate position of the defect, and outputs it as an inspection result. The defect inspection apparatus 100 shown in FIG. 1 is constituted of an image acquisition subsystem 101 that acquires an image of the wafer 104, a computer subsystem 102 that processes acquired image data to extract position information of a defect candidate portion, a storage device 103 in which the acquired image data, software necessary for image processing, etc. are stored, etc.

The image acquisition subsystem 101 is constituted of a light source 106 that irradiates the wafer 104 with light, a detection optical system 107 that detects scattered light or reflected light generated by irradiating the wafer 104 with light, a sensor 108 that converts the signal light detected by the detection optical system 107 into an electric signal, an AD converter 109 that converts the analog electric signal output from the sensor 108 into a digital signal, a stage 105 that places the wafer 104 thereon and moves an arbitrary portion of the wafer 104 to a light irradiation position of the light source 106, a control unit 110 that controls the operation of each component of the image acquisition subsystem 101 and the overall operation of the defect inspection apparatus 100, etc.

In dark field optical inspection, the light source is a laser and detects scattered light as signal light. In a bright field inspection apparatus, the light source is a broadband light source or the like and detects reflected light as signal light. Further, in an electron beam inspection apparatus, an electron source is used instead of the light source and detects secondary electrons or reflected electrons generated by irradiating the wafer with an electron beam. Thus, the image acquisition subsystem may be either a dark field type, a bright field type, or an electron beam type. In the present embodiment, an inspection apparatus using the dark field will be described as an example.

The computer subsystem 102 is constituted of a control PC 111 and an image processing unit 112.

The control PC 111 functions as a user interface that sets various conditions for information processing for positional deviation correction and defect inspection to be described later.

The image processing unit 112 uses the output signal of the AD converter 109 to generate a swath image of the wafer 104. Further, the image processing unit 112 executes the information processing for positional deviation correction, which will be described later. Here, the swath image is an image acquired by irradiating the wafer 104 by the light source 106 while continuously moving the stage 105 with the wafer 104 placed thereon in the direction of one axis and is rectangular image data elongated in a moving direction of the stage 105. In order to process target image data, the image processing unit 112 often adopts a parallel computer capable of operating a plurality of computers in parallel.

The storage device 103 is a device that stores various data used by the control PC 111 and the image processing unit 112, and is configured by a large capacity storage means such as a magnetic disk. The storage device 103 stores therein a program 113 used for various processing and a recipe 114 that is software for setting conditions such as an image acquisition method and an image method.

Next, the operation of the defect inspection apparatus 100 of the present embodiment will be described with reference to FIGS. 2, 3, 4, and 5.

Figure 2:
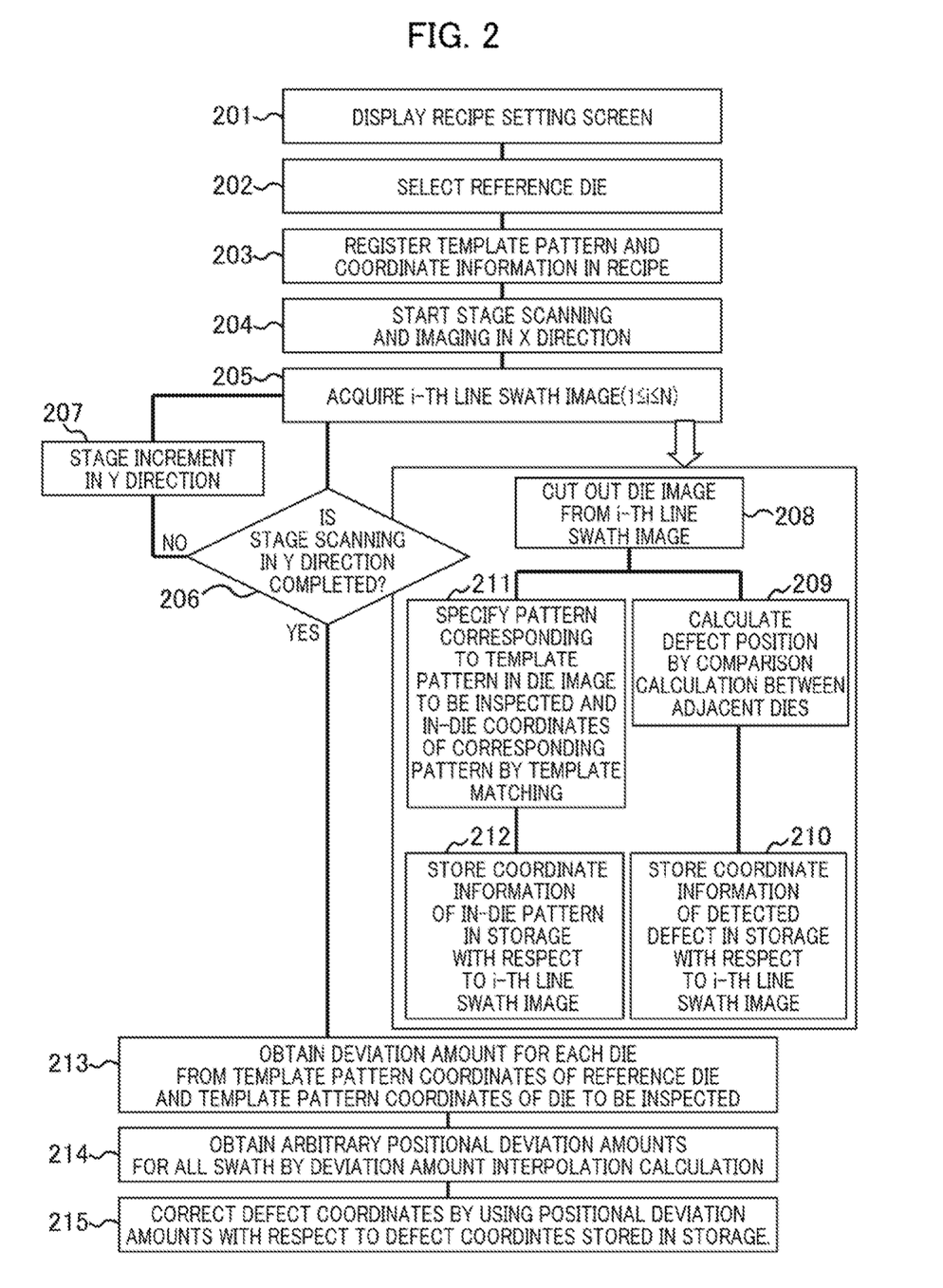
FIG. 2 shows a flowchart of defect inspection according to the first embodiment.
Figure 3:
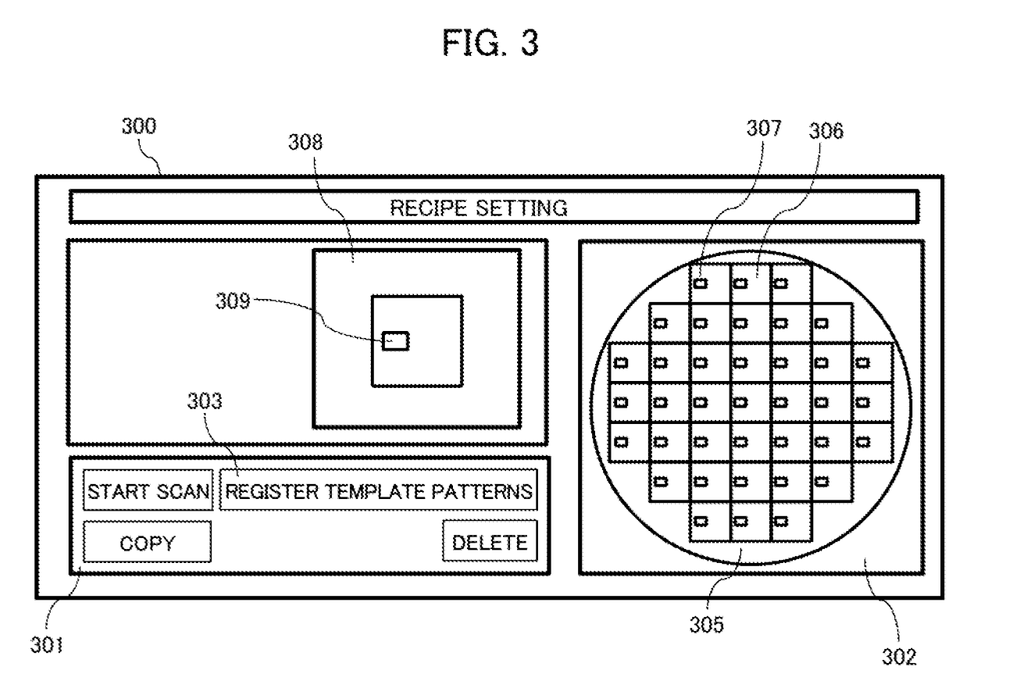
FIG. 3 shows a recipe setting screen of the defect inspection apparatus according to the first embodiment.

First, a recipe setting screen is displayed in Step 201 of FIG. 2. FIG. 3 shows a configuration example 300 of the recipe setting screen. This screen is displayed on the display of the control PC 111 and functions as a user interface. A start button 303 of a template pattern registration screen, a start button 304 of an offset setting screen, and the like are collectively arranged in an area 301. A wafer map 305 which is an overall image of the wafer 104 is displayed on a wafer map display screen 302. A die 306 and a template pattern setting area 307 to be described later are typically shown on the wafer map 305. 37 dies in total are formed on the wafer map 305 shown in FIG. 3.

Figure 4:
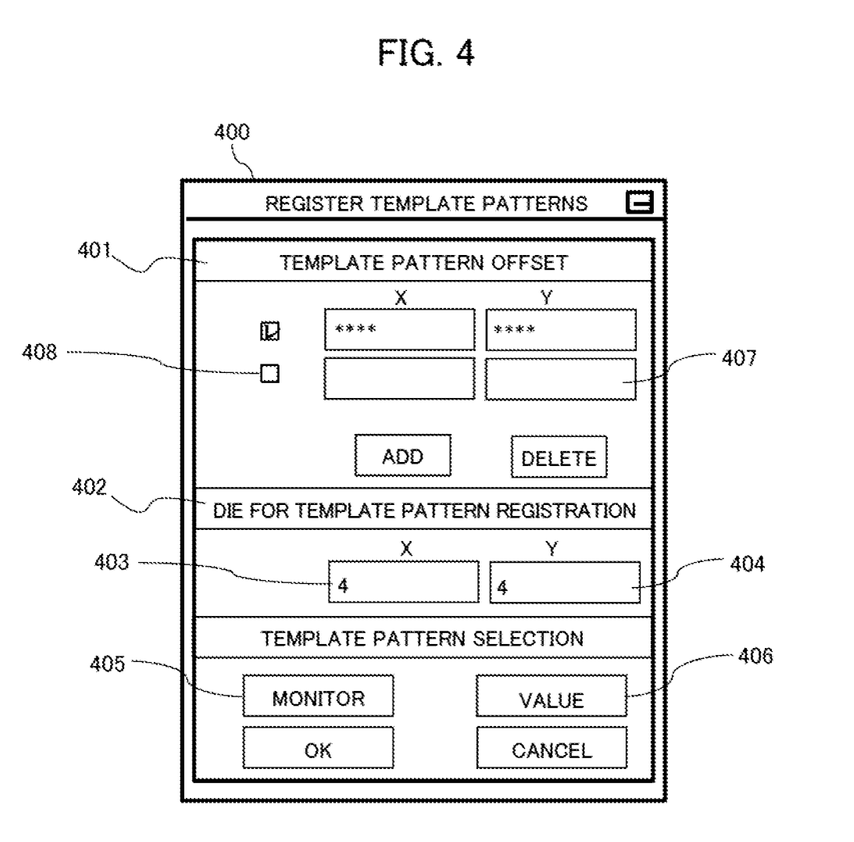
FIG. 4 shows a setting screen of a template pattern.

In Step 202 of FIG. 2, a reference die, a template pattern, and coordinates are selected. When the start button 303 of the template pattern setting screen shown on the recipe setting screen 300 of FIG. 3 is pressed, a template pattern registration screen 400 shown in FIG. 4 is popup-displayed as another screen.

A reference die for selecting a template is set onto a reference die setting screen 402 displayed on the template pattern registration screen 400. At the time of setting thereof, information of the position of the die displayed on the wafer map 305 is input to an X coordinate input box 403 and a Y coordinate input box 404. In FIG. 4, the numerical values of (4, 4) corresponding to a matrix number of the central die of the wafer map 305 (meaning the fourth from the left in an X-axis direction and the fourth from the bottom in a Y-axis direction) are input.

In the present embodiment, the center die of the wafer map is selected as the reference die, but in principle, any die in the wafer may be used as the reference die. However, a mechanical coordinate system for controlling the stage 105 often defines the center of the wafer as the origin, and mechanical elements for moving the stage also often have the highest control accuracy near the center of the wafer.

Accordingly, the accuracy of the positional deviation correction becomes high when the template pattern is set by using the die at the center of the wafer.

Next, in Step 203 of FIG. 2, the template pattern and coordinate information are registered in the recipe. When a monitor button 405 is pressed after its input, an enlarged image of the reference die is displayed on a die display screen 308 of FIG. 3. While referring to the enlarged image of the die, a device operator specifies an appropriate template pattern, for example, 309 and inputs coordinate information of the template pattern 309 to each of the X and Y input boxes shown in an offset setting area 401.

In principle, if one template pattern is set, the positional deviation correction is possible, but the accuracy of the positional deviation correction is improved if a plurality of template patterns are set. Therefore, an "ADD" button is pressed on the template pattern setting screen shown in FIG. 4, so that blank X and Y input boxes 407 are additionally displayed. The input boxes can also be deleted. In that case, a check mark is entered in a check box shown on the left side of the input boxes, and a "Delete" button is pressed, so that the input boxes are deleted, thereby making it possible to delete the coordinate information of the registered template pattern.

Further, it is also possible to set not only one reference die but also a plurality of reference dies. When the template patterns are obtained from a plurality of dies, the plurality of template patterns may be averaged to generate one template pattern.

After inputting, an OK button is pressed to complete a template pattern and coordinate setting input. Consequently, the settings are stored in the recipe 114.

Figure 5:
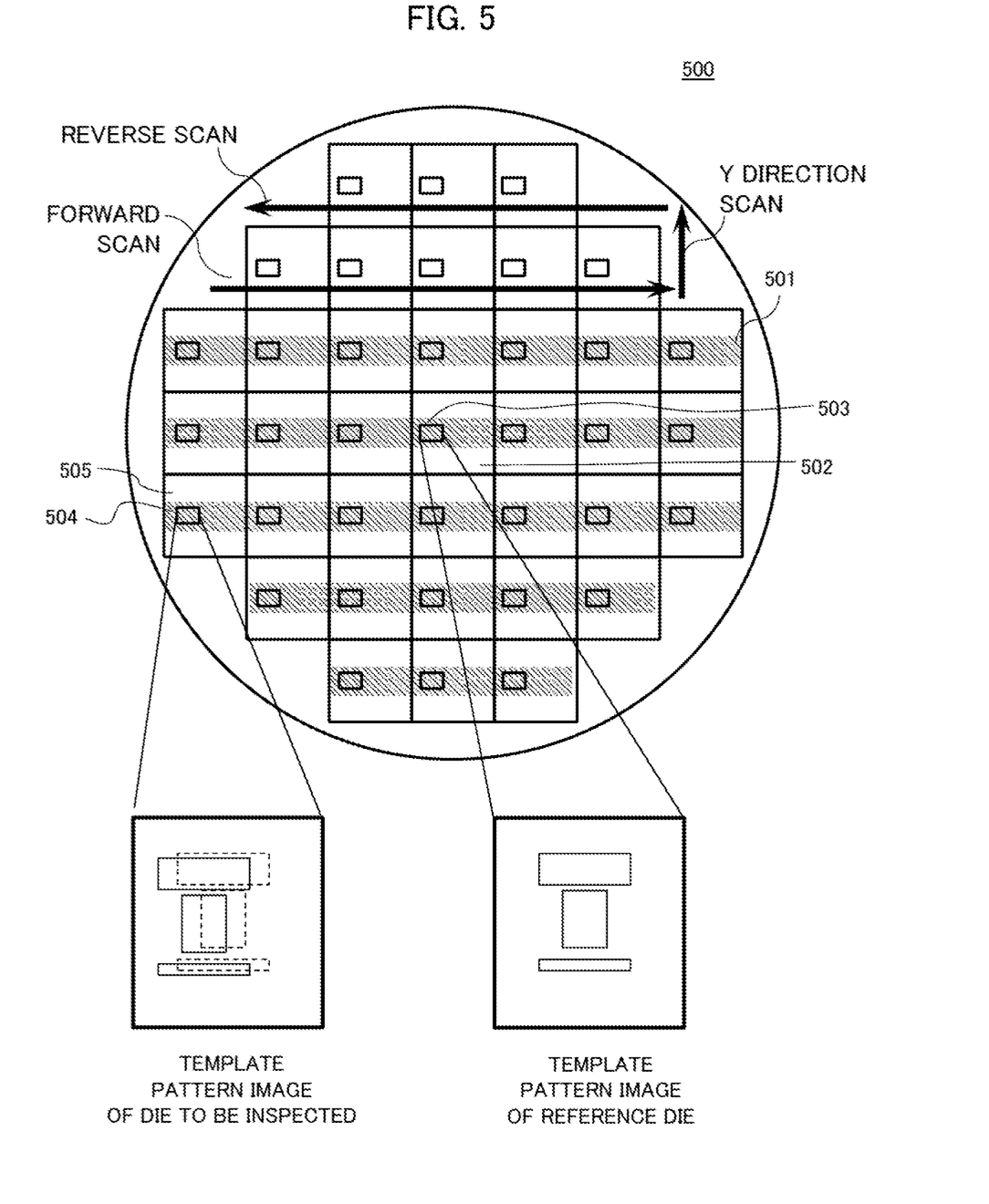
FIG. 5 is a typical diagram showing the relationship between a die formed on a wafer and a stage scanning direction.

After Step 203 in FIG. 2 is completed, when a "Start Scan" button in FIG. 3 is pressed, stage scanning and imaging are started. FIG. 5 typically shows the relationship between the stage scanning and the wafer map. FIG. 5 shows a state in which swath images 501 are acquired up to the fifth row of the 37 dies arranged in 7 rows×7 columns on the wafer. There are two types of stage scanning corresponding to forward scanning (Forward) and reverse scanning (Reverse). In the case of FIG. 5, the scanning direction from left to right on the paper is the forward direction, and the scanning direction from right to left on the paper is the reverse direction. The stage scanning is started from the lower left corner of the paper. After moving the dies on the same row to the right end to capture a swath image (Step 205 in FIG. 2, for example), the stage is moved upward in a Y direction on the paper (Step 207 in FIG. 2) if a light irradiation position for imaging dose not reach the die in the top row of the wafer 104 (decision Step 206 in FIG. 2). Then, the stage scanning is performed in the reverse direction to acquire a swath image. Incidentally, since it is necessary to acquire a plurality of swath images in order to acquire images for one die, the feeding amount of the stage in the Y direction in Step 207 of FIG. 2 actually corresponds to the length in the lateral direction of swath images.

On the lower side of the paper of FIG. 5, there is typically shown a state in which the template pattern is offset (positionally deviated) between the reference die and an inspection die. In the present embodiment, since the wafer center die is selected as the reference die and the template pattern is set, the template pattern is not positionally displaced in the wafer center die. On the other hand, in a die 505 shown as an example of the inspection die, for example, a template pattern shown by a solid line is deviated from the position of the template pattern on the reference die shown by a dotted line and imaged. In the inspection apparatus of the present embodiment, the image processing unit 112 compares the coordinate information of the template pattern of the inspection die with the coordinate information of the template pattern of the reference die to calculate the amount of positional deviation, and obtains the amounts of positional deviation of all the dies on the wafer. The obtained amounts of positional deviation are finally used for coordinate correction of a defect candidate position.

Return to the description of the flowchart in FIG. 2. When a swath image of each line is acquired in Step 205, an imaging flow of a swath image of the next line (Steps 206 and 207) and an image processing flow are advanced in parallel.

The acquired swath image is transmitted to the image processing unit 112 where die image cut-out processing is executed (Step 208). Thereafter, a positional deviation amount detection flow (processing after Step 211) and a defect detection flow (processing after Step 209) for each inspection die are branched, and each processing is advanced in parallel.

In Step 209, the image processing unit 112 executes comparison calculation processing using the cut-out image of inspection die and the image of the adjacent die and detects a defect candidate position by difference image comparison. Information of the detected defect candidate position is transmitted and stored in the storage device 103. Coordinate information of the defect candidate position obtained in this stage is a relative coordinate obtained from the number of pixels with respect to the adjacent die image on the swath image, and is a coordinate including an error due to various kinds of variation factors such as variation in a stage moving speed.

In parallel, in Step 211, the image processing unit 112 executes template matching to obtain a pattern corresponding to the template pattern included in each inspection die and coordinate information of this pattern. The obtained coordinate information is transmitted to and stored in the storage device 103. Software for executing the template matching is stored in a storage means (hard disk or the like) in the image processing unit 112. The software is called by a processor in the image processing unit 112 upon its execution, and then is also stored in the memory in the image processing unit 112 and executed.

When the stage scanning in the Y direction is completed in Step 206, swath images of all the dies are acquired, and the processing of calculating the amount of positional deviation is executed by the image processing unit 112.

The image processing unit 112 identifies the corresponding pattern of the template pattern included in the image of the inspection die by template matching, measures the distance from the origin of the coordinates in the die set for each image of the inspection die in pixel units, and stores it in the memory as coordinate information. Further, the image processing unit 112 compares the coordinate information of the template pattern of the reference die with the coordinate information of the corresponding pattern of the inspection die, and calculates a comparison result as a positional deviation amount. The calculated positional deviation amount is stored in the memory in association with the die matrix number. Consequently, the positional deviation amounts can be obtained for all dies.

Incidentally, the positional deviation amount may be obtained in distance units in addition to being obtained in pixel units, or may be obtained as some amount of information associated with the positional deviation amount.

When a plurality of coordinate information of template patterns are set on the recipe setting screen of FIG. 4, a plurality of positional deviation amounts are calculated corresponding to the set number of template patterns. When the plurality of positional deviation amounts are obtained, the average value is adopted as the positional deviation amount. As described above, the use of the average value further improves the accuracy of the positional deviation correction.

In Step 214, the image processing unit 112 executes interpolation calculation using the deviation amount obtained in Step 213. As indicated in 602 of FIG. 6 to be described later, the set position of the template pattern is only a point within the die. It is therefore necessary to estimate by interpolation calculation, the amount of deviation at a position other than the set position of the template pattern within the die. The interpolation calculation uses the positional deviation amounts of all the dies on the wafer. The interpolation calculation is performed so that the positional deviation amounts of the respective dies are smoothly connected. Typically, spline interpolation or the like is applied. Similar to the template matching, software for the interpolation calculation is stored in the storage means in the image processing unit 112 and is executed by the processor.

In Step 215, the processing of correcting the defect coordinates stored in the storage device 103 is executed by using the positional deviation amounts for all the dies obtained in Step 214. The defect coordinate correction processing is executed by the image processing unit 112, but the control PC 111 may be provided with the function of correcting the defect coordinates.

Figure 6:
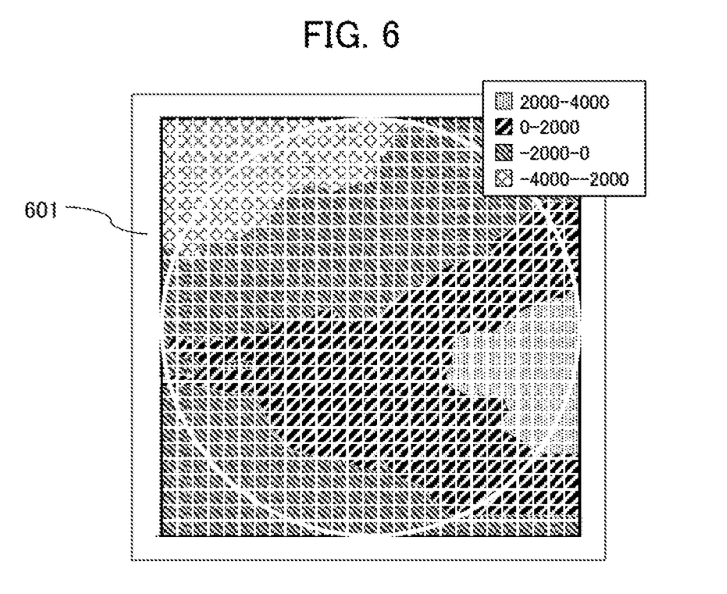
FIG. 6 is an example of a positional deviation amount map according to the first embodiment.

FIG. 6 shows an example of a positional deviation amount map that visualizes the positional deviation amount obtained for each die. The positional deviation amount tends to have a similar value distributed for each specific region on the wafer 104. It is considered that this is because the positional deviation of the processed image mainly occurs depending on the operation accuracy of the stage 105. The operation accuracy of the stage 105 depends on a shape error of a guide included in the stage 105, and the shape error is generally a long cycle, for example, a 100 mm cycle.

According to the positional deviation map illustrated in FIG. 6, even if the positional deviation amount is one point, the die pitch ranges from about 8 mm to 35 mm, which is shorter than the cycle of the shape error of the stage. Therefore, the error by interpolation is considered to be negligible. Thus, when creating the positional deviation map, the control PC 111 performs interpolation calculation on the positional deviation calculated using the template pattern to thereby obtain the positional deviation amount at a portion where no template pattern exists. Consequently, even if the number of template patterns is one, the positional deviation amount can be accurately obtained at each coordinate point on the die 11.

With the above operation, the template pattern and the coordinates are stored in the recipe 114, and the effect can be confirmed by inspection using the stored recipe. After the effect is confirmed, when the second and subsequent wafers or wafers in another lot are inspected, it is not necessary to execute Steps of 201 to 203 of FIG. 2, and it is possible to read the template pattern and coordinates included in the already saved recipe 114 and execute Steps after 204. Since the template pattern and coordinates are common, for example, even if an offset occurs in a 2 μm coordinate due to lack of accuracy in the wafer alignment, etc., the defect detection coordinates and the template deviation amount both cause an offset of 2 μm, and the defect detection coordinates are corrected, whereby the offset is not superimposed on the corrected detected coordinates. Thus, it is possible to correct the amount of image deviation caused by insufficiency of device stability or the like.

First Embodiment: Summary

The defect inspection apparatus 100 according to the first embodiment calculates the positional deviation amount for each coordinate point on the swath image by comparing the swath image and the template pattern, and performs interpolation calculation on the portion not compared with the template pattern to calculate the amount of positional deviation. Consequently, it is possible to accurately obtain the amount of positional deviation at any portion on the die 11. Thus, the defect position specified by using the processed image can be corrected with satisfactory accuracy. Further, the template pattern and coordinates included in the recipe 114 are stored, and the stored template pattern and coordinates are used, thereby making it possible to correct the image deviation amount due to the insufficiency of device stability or the like.

Second Embodiment

In the first embodiment, it has been described that the positional deviation of the swath image occurs due to the shape error included in the stage 105. Since the stage 105 is a mechanical member, the shape error may have a certain degree of periodicity and may have a distribution different for each driving direction of the stage 105. Therefore, in the second embodiment of the present invention, description will be made as to an example in which a positional deviation map is created for each driving direction of the stage 105. The configuration of a defect inspection apparatus 100 is similar to that of the first embodiment.

Figure 7:
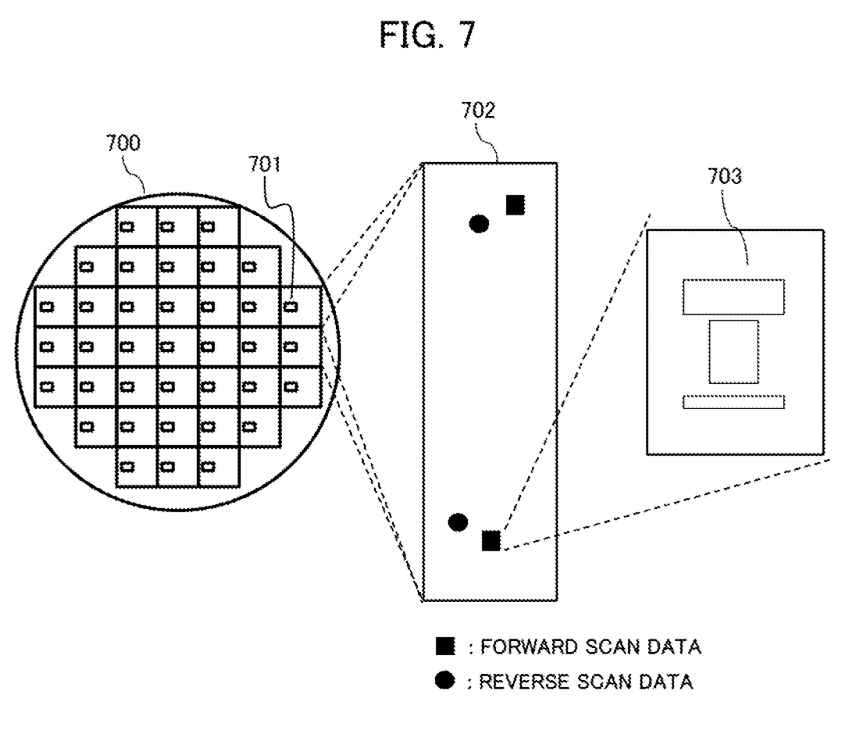
FIG. 7 is a typical diagram showing the relationship between a wafer map, the position of a template pattern, and the figure of a template pattern.

FIG. 7 typically shows the manner in which a swath image obtained by forward stage scanning and a swath image obtained by forward stage scanning in a reverse direction are different. Reference numeral 702 in FIG. 7 is a diagram in which two dies of a wafer map 700 are superposed so that the same die coordinates are at the same point, and is a diagram in the case of two templates. This explains a case where forward/reverse directions of the stage scanning direction with respect to the same template differ between two dies. Dots each indicated by a square indicates a template pattern obtained in the swath image in the forward direction, and dots each indicated by a circle indicates a template pattern obtained in the swath image in the reverse direction. It is indicated that even the same template patterns are different in detection position on the swath images. A figure 703 shown on the right side of the paper is an enlarged view showing the shape of an actual template pattern.

Figure 8:
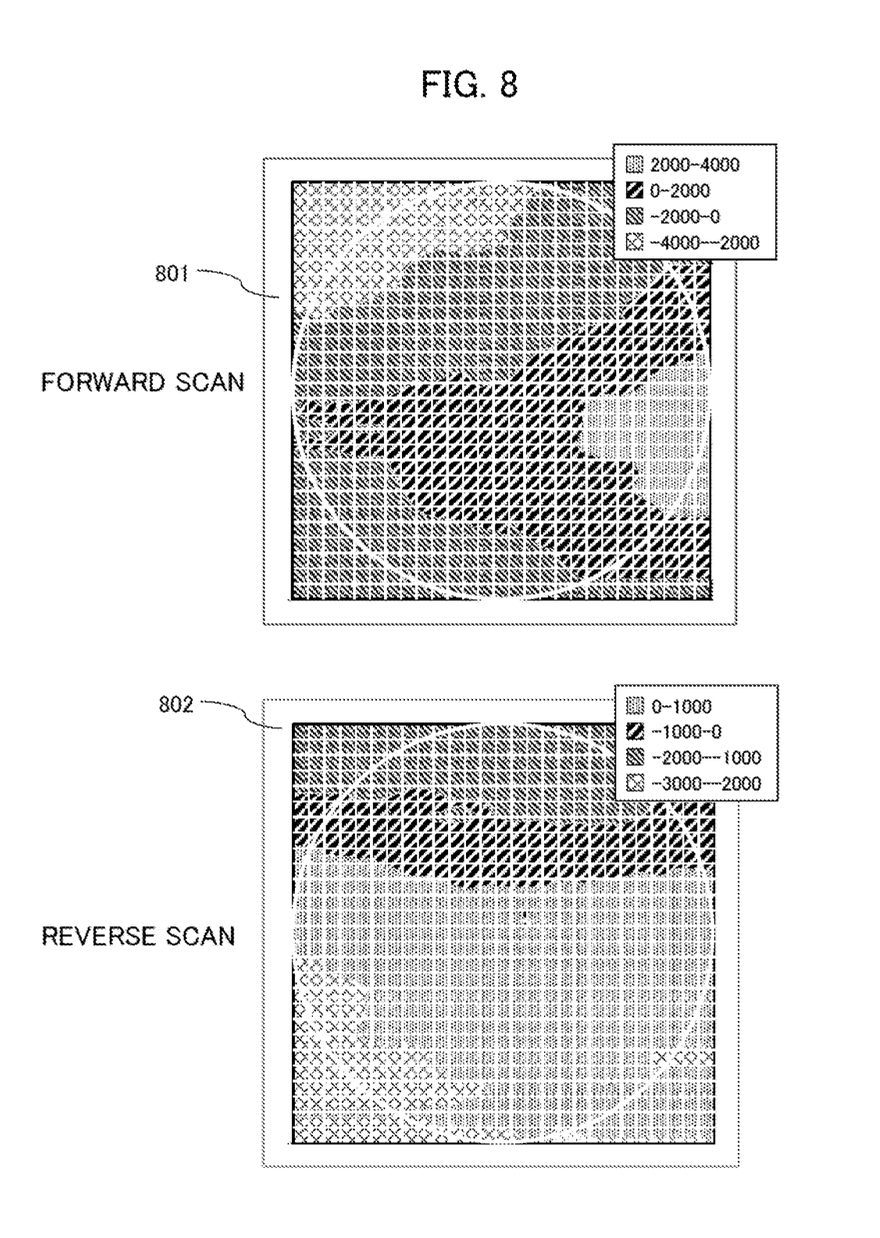
FIG. 8 is an example of a positional deviation amount map according to a second embodiment.

FIG. 8 shows an example of a positional deviation amount map obtained for each scanning direction of the stage 105. As shown in FIG. 8, the positional deviation map obtained when the stage 105 is driven in a certain direction (forward direction), and the positional deviation map obtained when the stage 105 is driven in a reverse direction (backward direction) have positional deviation amount distributions different from each other. Therefore, it is considered that the defect positional deviation can be corrected more accurately by obtaining the positional deviation map for each driving direction of the stage 105. Similar to the first embodiment, the positional deviation map is not necessarily required. It is also possible to hold in the storage unit in numerical values, the positional deviation amount calculated by comparing the swath image and the template pattern by a calculation unit in consideration of the stage driving direction, and the interpolated positional deviation amount interpolated and calculated for the area free of the template pattern from the positional deviation amount based on the template pattern and to correct the positional deviation of a defect at an arbitrary portion.

The image processing unit 112 can also obtain the positional deviation amount of the swath image using a plurality of template patterns. For example, a first positional deviation map is created using a first template set obtained by selecting template patterns at different positions on the swath image. A second positional deviation map is created using a second template set obtained by selecting template patterns at a position different from the first template set. The image processing unit 112 further creates an average positional deviation map by averaging the first positional deviation map and the second positional deviation map. By using the average positional deviation map derived from a plurality of template sets, the accuracy of positional deviation correction can be further improved. The number of template sets may be three or more. The template patterns included in each template set may partially overlap.

The inspection apparatus of the present embodiment uses both the swath image obtained by the stage scanning in the forward direction and the swath image obtained by the stage scanning in the reverse direction to obtain the positional deviation correction amount. It is therefore possible to realize more accurate positional deviation correction than in the inspection apparatus of the first embodiment.

Third Embodiment

In the third embodiment, description will be made of a configuration example in which a coordinate origin offset is matched between the defect inspection apparatus 100 and the reviewing apparatus by sharing the template pattern among a plurality of the defect inspection apparatus 100.

At a defect position specified by the defect inspection apparatus 100, a reviewing apparatus such as a scanning electron microscope is used to observe the specific shape of its defect, etc. A reviewing apparatus such as a review SEM acquires a wide-field low magnification image, specifies a defect position on the low magnification image, and acquires a high-magnification and high-definition image at the specified location. When the defect position accuracy is low, it is necessary to take a large field of view at low magnification. In this case, the finer the target defect, the more difficult it is to identify the defect position, and the probability of success is reduced. When the defect position identification fails, the defect detected by the inspection apparatus is not recognized as a defect and is regarded as an erroneous detection. Further, when an offset is included in the origin position of the coordinates between the inspection apparatus and the reviewing apparatus, no defect is included in the low magnification image. Therefore, it is extremely important that the origin position is the same between the inspection apparatus and the reviewing apparatus.

Figure 9:
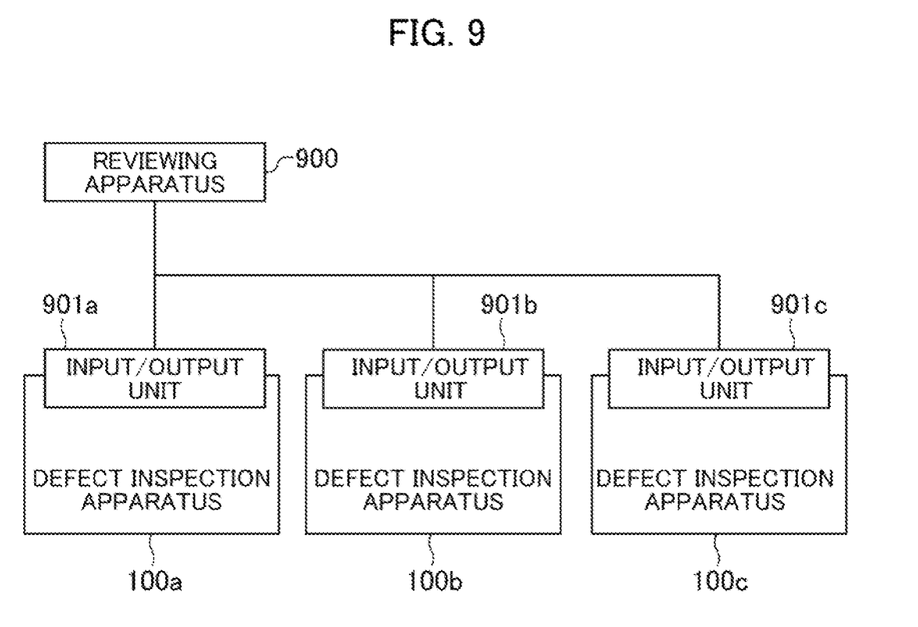
FIG. 9 is a typical diagram showing the relationship of connection between a defect inspection apparatus 100 and a reviewing apparatus 900.

FIG. 9 is a typical diagram showing a relationship of connection between the defect inspection apparatus 100 and the reviewing apparatus 900. The reviewing apparatus 900 includes, for example, a review SEM or the like. Here, there is shown an example in which a plurality of defect inspection apparatus 100 and one reviewing apparatus 900 are connected. The defect inspection apparatuses 100 and the reviewing apparatus 900, and the respective defect inspection apparatuses 100 can be connected via input/output units 901a to 901c. The input/output units 901a to 901c are, for example, input/output interfaces for digital signals provided in the computer subsystem 102 and are interconnected with another defect inspection apparatus or reviewing apparatus 900 via a transmission means such as a wired LAN or a fiber channel. For convenience of description, each defect inspection apparatus 100 is distinguished by an alphabetical suffix. Each defect inspection apparatus 100 has the configurations described in the first to third embodiments, but the constituent members such as the stage 105, the light source 106, the detection optical system 107, and the sensor 108 are taken to have individual differences.

The defect inspection apparatus 100a identifies a defect position on the wafer 104 and transmits coordinate data of the defect position to the reviewing apparatus 900. The user observes a defect with the reviewing apparatus 900 that has acquired the defect coordinate data from the defect inspection apparatus. Thus, the reviewing apparatus observes the specific shape or the like of the defect. If there is a difference (offset) in the coordinate origin between the defect inspection apparatus 100a and the reviewing apparatus 900, the reviewing apparatus 900 specifies the amount of the offset. The reviewing apparatus 900 corrects the coordinate origin offset and then outputs a reviewing result.

There is a case where in a semiconductor manufacturing line, a plurality of defect inspection apparatuses exist, and the coordinates need to be matched between the defect inspection apparatuses. For example, similar even to the defect inspection apparatuses 100b and 100c, the origin coordinate offset can be specified by comparing the defect coordinates from the defect inspection apparatus and the reviewing result of the reviewing apparatus 900. The specified origin coordinate offset is put into the communication means or the inspection recipe of the defect inspection apparatus in advance, shared, and held in the storage unit of the defect inspection apparatus. However, when the number of the defect inspection apparatus 100 is large, it takes a lot of time to individually specify the coordinate origin offset. Therefore, if the defect can be observed by the reviewing apparatus 900 after the coordinate origins of the defect inspection apparatuses (for example, 100a to 100c) are previously aligned between the apparatuses by the following procedure, the specific shape or the like of the defect can be reviewed more efficiently and quickly fed back to the manufacturing process of the semiconductor line.

The procedure for obtaining the coordinate origin offset between the defect inspection apparatus 100a and the reviewing apparatus 900 is the same as above. The defect inspection apparatus 100a transmits to the defect inspection apparatus 100b, each template pattern used to obtain the positional deviation amount and the coordinates thereof, and the value of the coordinate origin offset between the defect inspection apparatus 100a and the reviewing apparatus 900. The defect inspection apparatus 100b similarly creates a positional deviation map using the template pattern. The defect inspection apparatus 100b corrects the defect position using the positional deviation amount or the positional deviation map, and further corrects the coordinate origin using the coordinate origin offset received from the defect inspection apparatus 100a. The reviewing apparatus 900 observes the wafer 104 using the inspection result in which the defect position and the coordinate origin are corrected. Thus, since the reviewing apparatus 900 does not need to correct the coordinate origin offset again, the number of steps when using the reviewing apparatus 900 can be reduced. Similarly, even with respect to the defect inspection apparatus 100c and later, the template pattern and the coordinate origin offset can be shared with the defect inspection apparatus 100*a*. Further, as a means for sharing each template pattern and its coordinates, and the coordinate origin offset value between the defect inspection apparatus 100*a* and the reviewing apparatus 900, a method of including these pieces of information in the inspection recipe created in the defect inspection apparatus 100*a* may be used.

In the third embodiment, when the reviewing apparatus 900 has the function of correcting the coordinate origin offset, it is not always necessary for the defect inspection apparatus 100 side to share the offset. In this case, it is sufficient for the defect inspection apparatus 100 to correct the defect position using the positional deviation amount or the positional deviation map and to transmit the inspection result to the reviewing apparatus 900 without correcting the coordinate origin offset.

In the third embodiment, the positional deviation amount or positional deviation map obtained by the defect inspection apparatus 100*a* can be shared between other defect inspection apparatus 100 (100*b* and 100*c* in FIG. 9). In this case, the other defect inspection apparatus 100 can perform each processing after correcting the position using the positional deviation map in advance. For example, the position where an image to be processed is acquired can be shifted in advance according to the positional deviation map. In this case, a slight positional deviation remains between the defect inspection apparatus 100 due to a reproducibility error or drift of the stage 105 of each defect inspection apparatus 100, etc. Each defect inspection apparatus 100 can correct this slight positional deviation by newly obtaining a positional deviation amount or creating a positional deviation map.

According to the defect inspection apparatus according to the third embodiment, it is possible to correct the defect positional deviation with high accuracy by obtaining the amount of positional deviation from the template pattern. Further, in a semiconductor manufacturing line having a plurality of defect inspection apparatus, the template pattern acquired by one defect inspection apparatus and its coordinate information, and the origin coordinate offset are shared between other defect inspection apparatus such as the second and third devices to thereby make it possible to reduce a machine difference in the coordinates of each defect inspection apparatus. Thus, the origin position offset between each defect inspection apparatus and the reviewing apparatus can be made common by obtaining the positional deviation amount between the plurality of defect inspection apparatus on a similar basis. As a result, it is not necessary to perform coordinate matching for the respective defect inspection apparatus individually in the reviewing apparatus, thereby leading to a reduction in time and effort.

<Regarding Modification of Present Invention>

The present invention is not limited to the above-described embodiments, but includes various modifications. For example, the above-described embodiments have been described in detail to explain the present invention in an easy-to-understand manner, and are not necessarily limited to those having all the configurations described. Also, a part of the configuration of one embodiment can be replaced with the configuration of another embodiment. Further, the configuration of another embodiment can be added to the configuration of one embodiment. In addition, it is possible to perform addition/deletion/replacement of other configurations on parts of the configurations of the respective embodiments.

LIST OF REFERENCE SIGNS

100 . . . defect inspection apparatus
103 . . . storage device
104 . . . wafer
105 . . . stage
106 . . . light source
107 . . . detection optical system
108 . . . sensor
110 . . . control unit
111 . . . control PC
112 . . . image processing unit
900 . . . reviewing apparatus

The invention claimed is:

1. A defect inspection method of acquiring information on candidate positions of defects existing on a wafer on which a plurality of dies are formed, comprising the steps of:
    moving a stage on which the wafer is held to acquire a swath image;
    extracting images of the plurality of dies from the swath image;
    displaying a setting screen for setting a template including a predetermined pattern in the die and coordinates of the predetermined pattern in a predetermined reference coordinate system on a user interface;
    executing a comparative inspection on the plurality of die images to obtain information on the candidate position of the defect;
    comparing the set coordinates of template and the coordinates of a pattern corresponding to the predetermined pattern included in the plurality of dies to obtain information about the amount of positional deviation with respect to the reference coordinate system for each of the plurality of dies; and
    correcting the information on the candidate position of the defect by using the information about the positional deviation amount;
    wherein displaying the setting screen on the user interface includes displaying the images of the dies on the user interface, along with prompting to input an offset with respect to the coordinate of the template; and
    wherein interpolation processing is performed using the positional deviation amount obtained for each of the plurality of dies to obtain the positional deviation amount with respect to the reference coordinate system at an arbitrary position of the swath image.

2. The defect inspection method according to claim 1, wherein as a reference image for setting the template, the die image near the center of the wafer in the plurality of die images is displayed on the setting screen with respect to the corresponding template.

3. The defect inspection method according to claim 1, wherein the template includes a plurality of predetermined patterns and coordinates of the plurality of predetermined patterns.

4. The defect inspection method according to claim 3,
    wherein in the step of obtaining the information about the positional deviation amount, the average value of the information about a plurality of the positional deviation amounts is obtained for each die on the wafer by using the plurality of predetermined patterns, and
    wherein in the step of correcting the position information of the defect candidate, the position information of the defect candidate is corrected using the information about the averaged positional deviation amount.

5. The defect inspection method according to claim 1, wherein spline interpolation is used as the interpolation processing.

6. The defect inspection method according to claim 1, wherein in the step of acquiring the swath image, the stage is moved in a forward direction to obtain a first swath image, and the stage is moved in a reverse direction to obtain a second swath image, respectively, and wherein in the step of correcting the position information of the defect candidate, the first defect candidate position information is corrected based on information about a first positional deviation obtained using the die image extracted from the first swath image, and the second defect candidate position information is corrected based on information about a second positional deviation obtained using the die image extracted from the second swath image.

7. The defect inspection method according to claim 1, wherein the reference coordinate system is a coordinate system in design data of the die.

8. The defect inspection method according to claim 1, wherein the reference coordinate system is a coordinate system with the center of the wafer as a reference.

9. A defect inspection apparatus which acquires information on candidate positions of defects existing on a wafer on which a plurality of dies are formed, the defect inspection apparatus comprising:

an image acquisition subsystem, which includes a light source that irradiates the wafer, a detector that detects scattered light or reflected light from the wafer, and a controller that controls the operation of each component of the image acquisition subsystem, which acquires a swath image of the wafer and outputs the same as an image signal;

a user interface which displays a setting screen for setting a template including a predetermined pattern in the die and the coordinates of the predetermined pattern in a predetermined reference coordinate system; and a computer subsystem configured to obtain information on the candidate position of the defect by performing a comparative inspection on a plurality of die images extracted from the swath image, compare the coordinates of the template and the coordinates of a pattern corresponding to the predetermined pattern included in the plurality of dies to obtain information about a positional deviation with respect to the reference coordinate system for each of the plurality of dies, and correct the position information of the defect candidate by using the information about the positional deviation;

wherein displaying the setting screen on the user interface includes displaying the images of the dies on the user interface, along with prompting to input an offset with respect to the coordinate of the template; and wherein interpolation processing is performed using the positional deviation amount obtained for each of the plurality of dies to obtain the positional deviation amount with respect to the reference coordinate system at an arbitrary position of the swath image.

10. The defect inspection apparatus according to claim 9, wherein the computer subsystem is configured to display on the user interface, a positional deviation map in which information about an amount of the positional deviation is mapped on the entire wafer, in response to an instruction to the user interface.

11. The defect inspection apparatus according to claim 9, wherein the computer subsystem is configured to display the die image near the center of the wafer on the input screen as the die for setting the predetermined pattern.

12. The defect inspection apparatus according to claim 9, wherein the computer subsystem is configured to display, in terms of a pattern corresponding to the predetermined pattern included in the plurality of dies, an image of the corresponding pattern and a positional deviation amount of coordinates of the corresponding pattern with respect to the reference coordinate system on the user interface.

13. The defect inspection apparatus according to claim 9, wherein the image acquisition subsystem includes a darkfield optical system which irradiates the wafer with light to detect scattered light.

14. The defect inspection apparatus according to claim 9, wherein the computer subsystem is configured to have an input/output unit for transmitting to other defect inspection apparatus or a reviewing apparatus, a recipe in which a template including the predetermined pattern, the coordinates of the predetermined pattern, or a coordinate origin offset value to the other defect inspection apparatus or the reviewing apparatus is registered.

* * * * *